United States Patent
Davis et al.

(10) Patent No.: US 6,332,267 B1
(45) Date of Patent: Dec. 25, 2001

(54) PROCESS OF MANUFACTURING A REMOVABLY INTERLOCKABLE ASSEMBLY

(75) Inventors: John G. Davis, Charlotte; Richard J. Noreika, Davidson; Michael C. Weller, Harrisburg, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/693,395

(22) Filed: Oct. 20, 2000

Related U.S. Application Data

(62) Division of application No. 09/275,756, filed on Mar. 25, 1999.

(51) Int. Cl.$^7$ ............................................... H05K 3/36
(52) U.S. Cl. ........................... 29/830; 29/892; 29/852; 257/675; 439/66
(58) Field of Search ........................ 29/825, 830, 846, 29/852, 840, 842; 439/66; 257/678

(56) References Cited

U.S. PATENT DOCUMENTS

| | | |
|---|---|---|
| 3,526,867 | 9/1970 | Keeler . |
| 4,887,338 | 12/1989 | Handler . |
| 4,950,173 | 8/1990 | Minemura et al. . |
| 5,006,073 | 4/1991 | Mennona, Jr. . |
| 5,110,298 | 5/1992 | Dorinski et al. . |
| 5,116,462 | 5/1992 | Bartha et al. . |
| 5,199,879 | * 4/1993 | Kohn et al. . |
| 5,299,939 | 4/1994 | Walker et al. . |
| 5,312,456 | 5/1994 | Reed et al. . |
| 5,411,400 | 5/1995 | Subrahmanyan et al. . |
| 5,432,681 | 7/1995 | Linderman . |
| 5,615,824 | * 4/1997 | Fjelstad et al. . |
| 5,654,070 | 8/1997 | Billarant . |
| 5,671,511 | 9/1997 | Hattori et al. . |
| 5,802,699 | * 9/1998 | Fjelstad et al. . |
| 5,812,378 | * 9/1998 | Fjelstad et al. . |
| 5,818,748 | 10/1998 | Bertin et al. . |
| 5,903,059 | 5/1999 | Bertin et al. . |
| 6,084,781 | * 7/2000 | Klein . |

* cited by examiner

*Primary Examiner*—Carl J. Arbes
(74) *Attorney, Agent, or Firm*—Ratner & Prestia; Lawrence R. Fraley, Esq.

(57) ABSTRACT

A process for making a removably interlockable connector assembly that includes a first connector having a head on a mesa and a second connector having an opening that receives the head on the first connector. The head on the mesa of the first connector and the material defining the opening in the second connector are flexible and sized, so that the head on the mesa of the first connector and the material defining the opening in the second connector flex as the head on the mesa of the first connector is inserted into the opening in the second connector. The head on the mesa of the first connector is formed by selectively etching portions of a first pad layer through openings in an etch resistant layer.

9 Claims, 5 Drawing Sheets

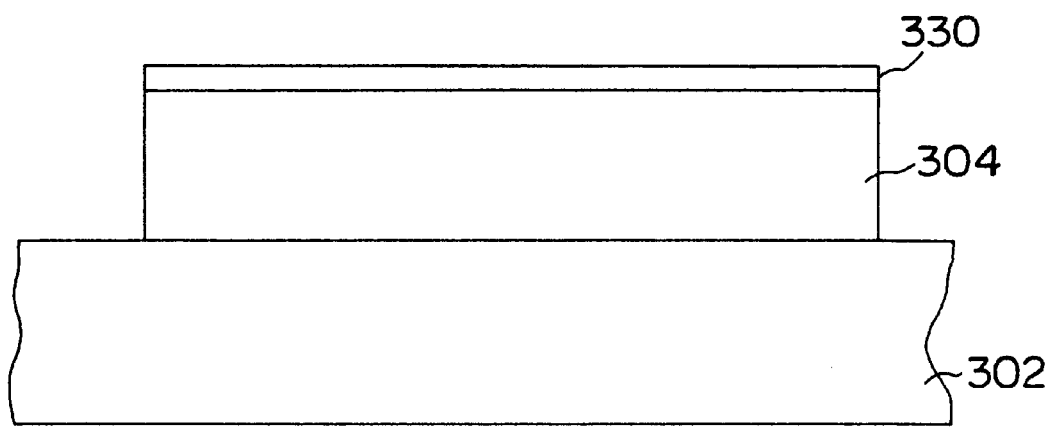
F I G. 11
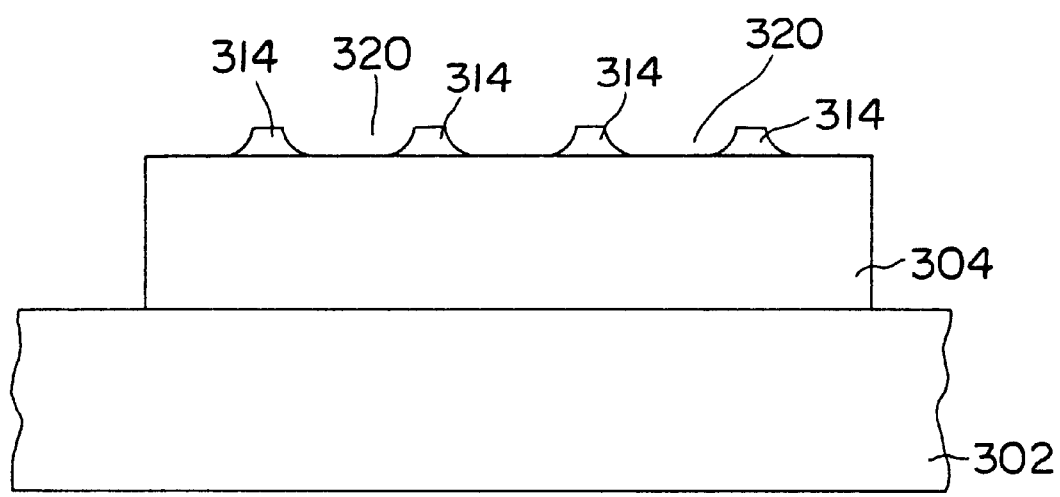
F I G. 12

PROCESS OF MANUFACTURING A REMOVABLY INTERLOCKABLE ASSEMBLY

This application is a divisional of U.S. patent application Ser. No. 09/275,756, which has been allowed filed Mar. 25, 1999.

TECHNICAL FIELD

The present invention relates generally to making interlockable connections that are removable and, more particularly, to a structure for mechanically, electrically, and removably coupling a circuit module to a circuit board.

BACKGROUND OF THE INVENTION

A circuit module may be connected to a circuit board so that it may communicate with other circuit modules through the circuit board. The connection of a circuit module to a circuit board has two aspects. First, there must be a good mechanical connection of the circuit module to the circuit board to ensure that the circuit module is securely fastened to the circuit board. Second, there must be an electrical connection between the circuit module and the circuit board to ensure that the circuit module can communicate with other circuit modules through the circuit board.

One method of connecting a circuit module to a circuit board is by a through-hole connection. For a through-hole connection, the signal lines of a circuit module are coupled to pins that emanate from the circuit module package. These pins are then inserted into plated through-holes in the circuit board. The plated through-holes are then filled with solder to mechanically connect the circuit module to the circuit board and to electrically connect the signal on the circuit module through the pin to the plated through-hole.

Another method of connecting a circuit module to a circuit board is by surface mount technology. One surface mount method uses leads shaped like the wings of a seagull. The gull-wing leads emanate from the perimeter of the circuit module package. The circuit module is oriented so that its gull-wing leads rest on conductive pads on the circuit board which are coated with a solder paste. The solder paste is then re-flowed to mechanically and electrically couple the gull-wing leads to the circuit board.

A ball grid array is another form of surface mount technology that eliminates the need for pins and the gull-wing leads. For a ball grid array, an array of conductive pads are formed on the bottom of a circuit module. A corresponding array of conductive pads are formed on the circuit board. To attach the circuit module to the circuit board, balls of solder are formed on the conductive pads of the circuit module. The circuit module is then placed on the circuit board with their corresponding conductive pads aligned. The circuit module and the circuit board are then sent through a re-flow furnace to form a metallurgical solder joint to mechanically and electrically couple the conductive pads of the circuit module to those of the circuit board.

After the circuit module has been attached to the circuit board, regardless of the method of attachment, the functionality of both the circuit board and the circuit module are often tested. If the circuit module is not functioning properly, it is replaced with another circuit module. If the circuit module was attached to the circuit board using one of the methods described above, the solder must be heated to allow removal of the circuit module from the circuit board. The circuit board is then prepared for the installation of the new circuit module.

For example, when an improperly functioning circuit module is mounted to a circuit board using ball grid array technology, the assembly of the board and module must be heated to melt the solder. The improperly functioning circuit module may then be removed from the circuit board. The conductive pads on the circuit board are prepared for a new module by removing any of the solder remaining from the solder used to attach the improperly functioning circuit module. The new circuit module may then be attached to the circuit board.

The method used to attach a circuit module to a circuit board often presents a compromise between the strength of attachment and the number of signal lines being coupled between the circuit board and the circuit module for a given board area. For example, through-hole connections provide secure attachment of the circuit module to the circuit board, but the pins are large and result in a reduced number of signal lines being coupled from the circuit module to the circuit board for a given board area. A similar compromise is encountered when attaching a circuit module to a circuit board using a ball grid array. For a given circuit board area, if the conductive pads are too small, the attachment will be weak. In contrast, if the conductive pads are too large, there is a risk of a solder bridge shorting adjacent conductive pads.

To overcome the shortcomings of conventional methods of attachment, a new removably interlockable assembly is provided. An object of the present invention is to provide an assembly having a connector that may be removably interlocked with a compatible connector. Another object is to provide a conductive removably interlockable assembly. A further object is to provide a connector for attaching circuit modules to circuit boards. Yet another object is to provide a removably interlockable solderless connection of a circuit module to a circuit board.

SUMMARY OF THE INVENTION

To meet these and other objects, and in view of its purposes, the present invention provides an assembly for making a removably interlockable connection. The assembly includes a first component. A first coupling pad is formed on the first component. A connector, formed in the first coupling pad, is adapted to be removably interlockable with a compatible connector.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 11 and 12 illustrate a process of manufacture of the third assembly according to the present invention.

DETAILED DESCRIPTION OF THE INVENTION

Device

Figure 1:
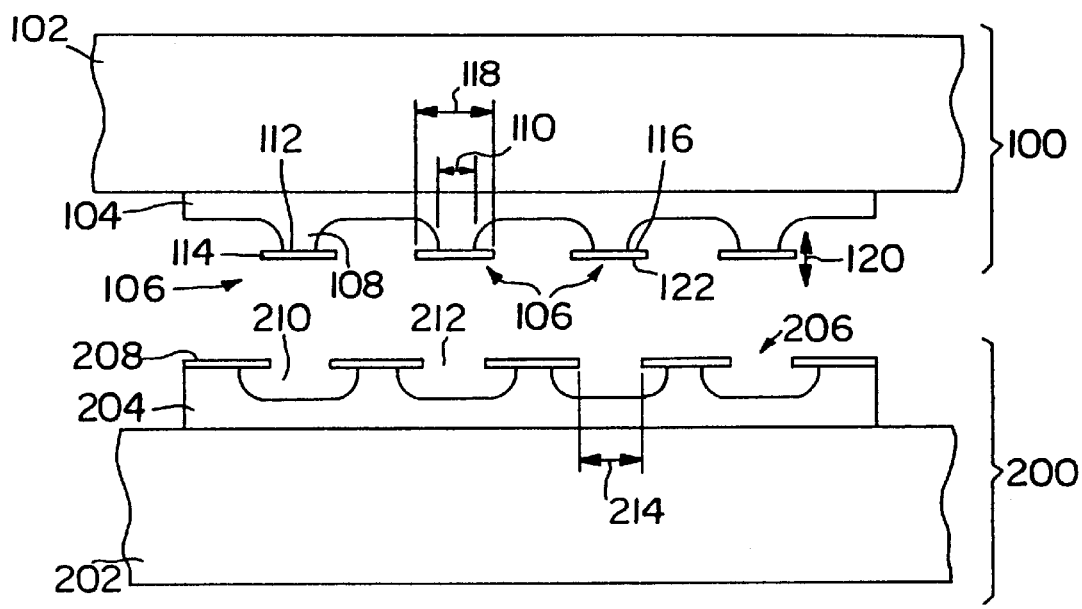
FIG. 1 is a cross-sectional view showing a first exemplary assembly and a second exemplary assembly according to the present invention.
Figure 2:
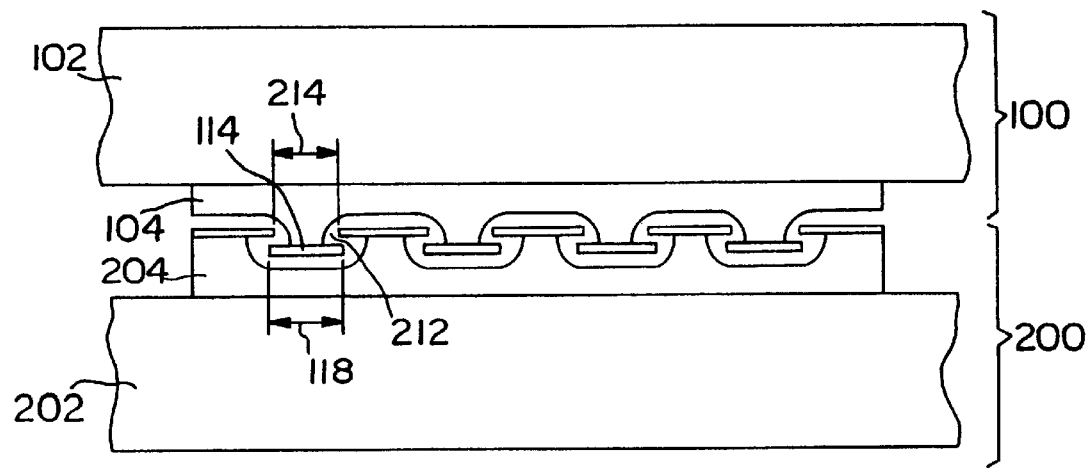
FIG. 2 is a cross-sectional view showing the first assembly removably interlocked with the second assembly according to the present invention.

Referring now to the drawing, in which like reference numerals refer to like elements throughout, FIG. 1 is a cross-sectional view showing a first exemplary assembly 100 according to the present invention and a second exemplary assembly 200 according to the present invention. The first assembly 100 and the second assembly 200 are removably interlockable: they can be both engaged (or interlocked) and disengaged (or separated). FIG. 2 is a cross-sectional view showing the first assembly 100 removably interlocked with the second assembly 200.

The first assembly 100 includes a first coupling pad 104 formed on a first component 102. First connectors 106 are formed in the first coupling pad 104 opposite the first component 102. The first connectors 106 are removably interlockable with compatible second connectors 206 of the second assembly 200.

Each first connector 106 includes a mesa 108 formed in the first coupling pad 104 opposite the first component 102. The mesa 108 has a mesa width 110 at the mesa top 112. A head 114 formed upon the mesa top 112 is adapted to be removably interlockable with the second connector 206 of the second assembly 200.

In an exemplary embodiment, the head 114 has a bottom 116 which is adjacent the mesa top 112 and is substantially planar. Each head 114 has a top 122 opposite its bottom 116. The head bottom 116 has a width 118 which is preferably greater than the mesa width 110. In an exemplary embodiment, the head bottom 116 has a width 118 ranging between 0.125 and 0.635 mm (5 and 25 mils or thousandths of an inch). In a preferred embodiment, the head bottom 116 has a width 118 equal to about 0.25 mm. (10 mils).

The second assembly 200 includes a second coupling pad 204 formed upon a second component 202. The second connector 206 is formed in the second coupling pad 204 and is adapted to be removably interlockable with the first connector 106 of the first assembly 100. The second connector 206 includes a cavity 210 formed in the second coupling pad 204. The second coupling pad 204 has a surface 208 opposite the second component 202. The cavity 210 is tapered toward an opening 212 in the surface 208 of the second coupling pad 204. The opening 212 has a width 214 less than the width 118 of the bottom 116 of the head 114 of the first connector 106.

To removably interlock the first assembly 100 with the second assembly 200, the first connectors 106 are aligned with the second connectors 206. The heads 114 of the first connectors 106 are then inserted into the cavities 210 of the second connectors 206. Because the width 118 of the heads 114 is greater than the width 214 of the opening of the cavity 210, at least one of the head 114 and the cavity opening 212 may flex to allow insertion of the head 114 into the cavity 210. As illustrated by arrows 120, the head 114 may be designed to flex in a direction substantially perpendicular to the surface 208 of the second coupling pad 204. Alternatively, the material forming the opening 212 of the cavity 210 may also be flexible to allow insertion of the head 114 into the cavity 210. As known to those skilled in the art, one or both of the first assembly 100 and the second assembly 200 may be vibrated while interlocking or disengaging the assemblies 100, 200 to promote the interlocking or disengaging process.

In an exemplary embodiment, as shown in FIG. 2, the head 114 is adapted to be in an unflexed state when interlocked with the connector 206 of the second assembly 200. As shown in FIG. 2, because the width 118 of the head 114 is greater than the width 214 of the opening 212 of the cavity 210, one or both of the head 114 and the material at the opening 212 may flex when the first assembly 100 is disengaged from the second assembly 200.

In an exemplary embodiment, the first coupling pad 104 and the second coupling pad 204 are formed of copper. The head 114 and the material forming the openings 212 of the cavities 210 may be formed of chrome. As known to those skilled in the art, the materials used to form the connectors 106, 206 are not limited to copper and chrome. In addition, the shapes of the first connector 106 and the second connector 206 are merely exemplary and may be varied as known to those skilled in the art. For example, one variation is illustrated by the cross-sectional view in FIG. 3 of a third exemplary assembly 300 according to the present invention.

Figure 3:
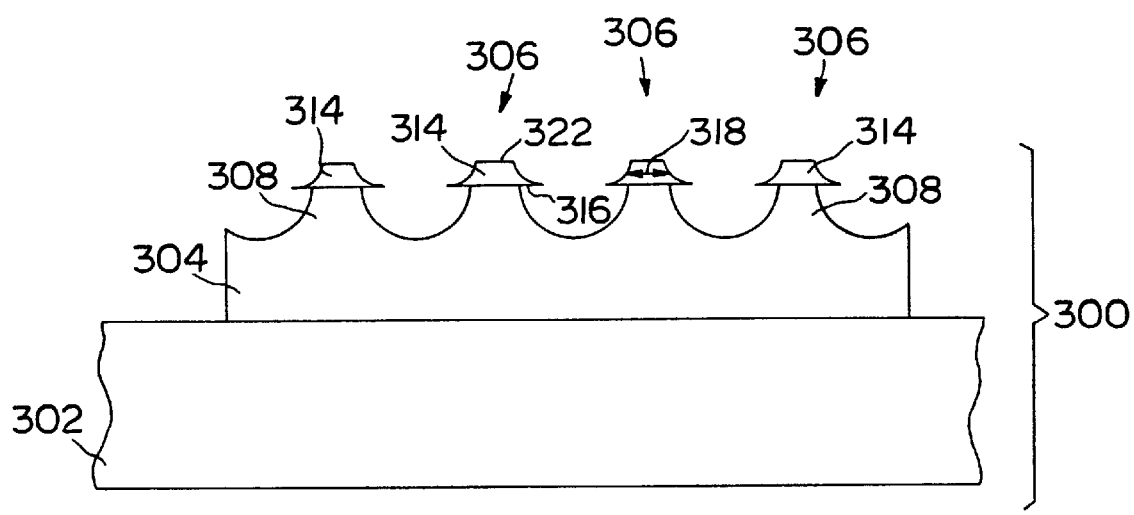
FIG. 3 is a cross-sectional view of a third exemplary assembly according to the present invention.

As shown in FIG. 3, a third coupling pad 304 is formed upon a third component 302. Third connectors 306 are formed within the third coupling pad 304. Each third connector 306 includes a mesa 308 with a head 314 formed upon the mesa 308. Each head 314 has a top 322 opposite its bottom 316. The head bottom 316 is adjacent the mesa 308. In this exemplary embodiment, the width 318 of the head 314 is tapered from the head bottom 316 towards the head top 322.

Figure 4:
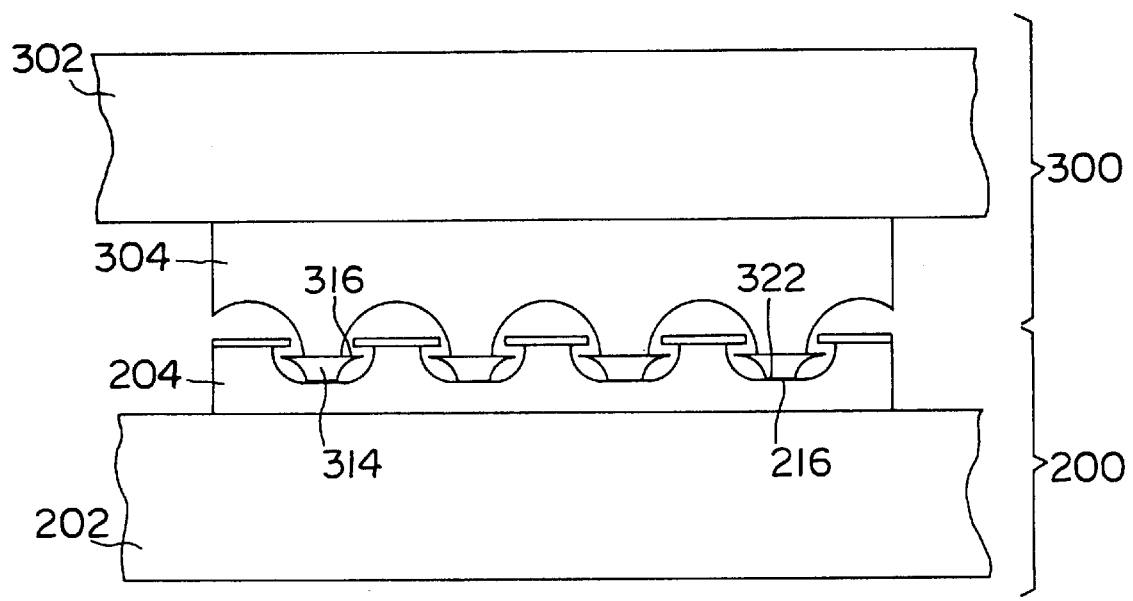
FIG. 4 is a cross-sectional view of the third assembly removably interlocked with the second assembly according to the present invention.

FIG. 4 shows a cross-sectional view of the third assembly 300 removably interlocked with the second assembly 200. The tapered head 314 of the third assembly 300 may be used to help align the third connectors 306 with the second connectors 206. In addition, the tapered head 314 allows the size of the head 314 to be adjusted so the bottom 316 of the head 314 is adjacent the opening 212 of the cavity 210 while the top 322 of the head 314 is coupled to the bottom 216 of the cavity 210.

In an exemplary embodiment, the component of one assembly is a circuit board and the component of another assembly is a circuit module. When the assemblies are removably interlocked, one or both of an electrical and a mechanical connection is made between the circuit board and the circuit module. For an electrical connection, the coupling pads and the connectors formed in the coupling pads may be made of a conductive material. The electrical connection may be made by the contact of the bottom of the head with the opening of the cavity or by contact between the top of the head and the bottom of the cavity.

Figure 5:
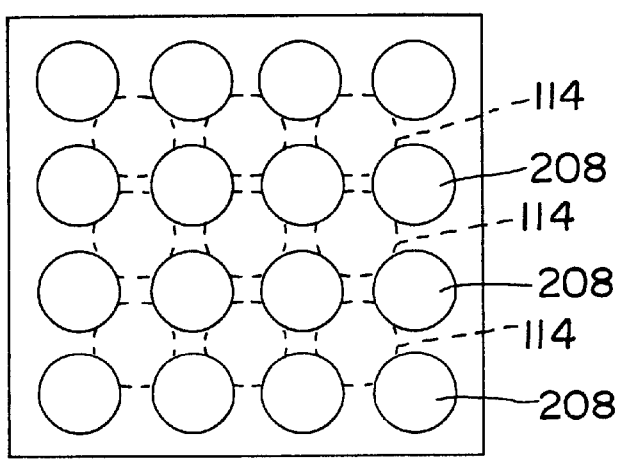
FIG. 5 illustrates a first exemplary orientation of connectors of an assembly according to the present invention attached to connectors of another assembly according to the present invention.
Figure 6:
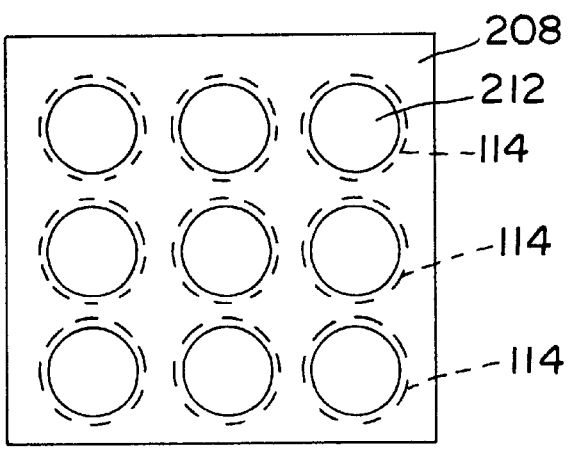
FIG. 6 illustrates a second exemplary orientation of connectors of an assembly according to the present invention attached to connectors of another assembly according to the present invention.

As known to those skilled in the art, the shape, size, and orientation of connectors according to the present invention may be varied. FIGS. 5 and 6 illustrate such exemplary variations. In FIG. 5, the head 114 of a first assembly 100 is interlocked in a cavity formed between four mesas in the second coupling pad 204. The mesas in the second coupling pad are illustrated in FIG. 5 by the remaining surface 208 of the second coupling pad 204. In FIG. 6, the head 114 of a first assembly 100 is interlocked in a cavity having an opening 212 in the surface 208 of a second coupling pad 204.

FIGS. 5 and 6 each illustrate an array of interlocked connectors. Each array may correspond to a single signal coupled from one component to another. This configuration may result in increased connection reliability because several connectors are used to couple each signal. The size and quantity of connectors used to couple each signal may be varied according to desired connection reliability and board or module area available for connection.

Figure 7:
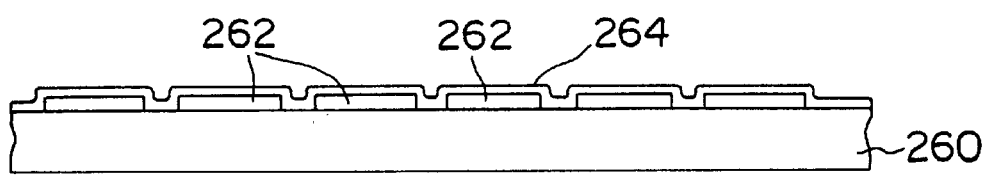
FIG. 7 is a cross-sectional view of circuit modules removably interlocked with a circuit board according to the present invention.

FIG. 7 is a cross-sectional view of assemblies according to the present invention used to removably interlock circuit modules 262 with a circuit board 260. In this exemplary embodiment, an epoxy layer 264 or coating is formed upon the circuit modules 262 which are removably interlocked with the circuit board 260. The epoxy layer 264 may increase the reliability of such a system by reducing the vibration of the circuit modules 262 which are interlocked with the circuit board 260. In addition, the epoxy layer 264 may-be designed to contract after application to ensure that the top of the head of one connector is securely coupled to the bottom of the cavity of another connector. Thus, the epoxy layer 264 may increase the reliability of an electrical connection between the circuit modules 264 and the circuit board 260.

Process of Manufacture

Figure 8:
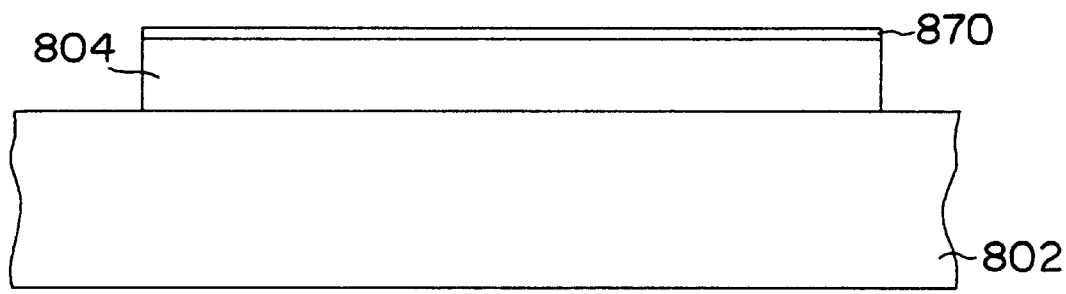
FIGS. 8 and 9 illustrate a process of manufacture of the first and second assemblies according to the present invention.
Figure 9:
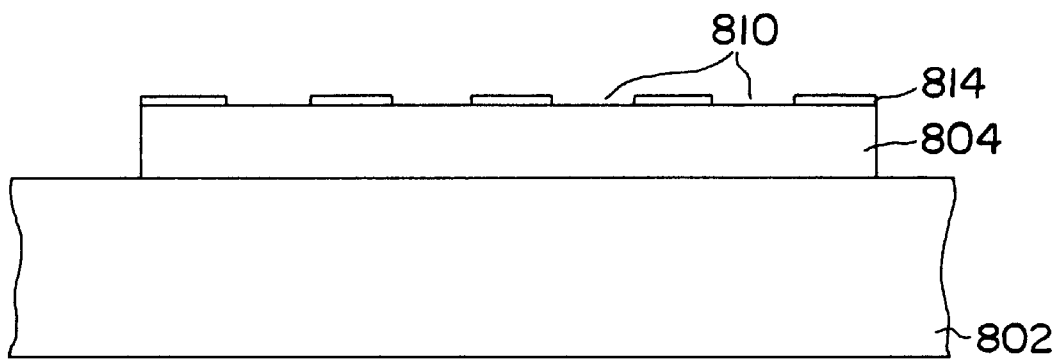

An exemplary process of manufacture of the first and second assemblies 100, 200 according to the present invention is described with reference to FIGS. 8 and 9. As shown in FIG. 8, a coupling pad 804 is formed upon a component 802. An etch resistant layer 870 is formed upon the coupling pad 804. As shown in FIG. 9, the etch resistant layer 870 is patterned to form a patterned etch resistant layer 814. The coupling pad 804 is then etched through the openings 810 in the etch resistant layer 814 to form interlockable connectors according to the present invention.

As known to those skilled in the art, the pattern formed in the etch resistant layer 870 may be varied to form different shapes, sizes, and orientations of connectors. For example, the above process may be used to form a first assembly 100 or a second assembly 200 according to the present invention. In an exemplary embodiment, the coupling pad 804 is a copper pad and the etch resistant layer 870 is a chrome layer.

Figure 10:
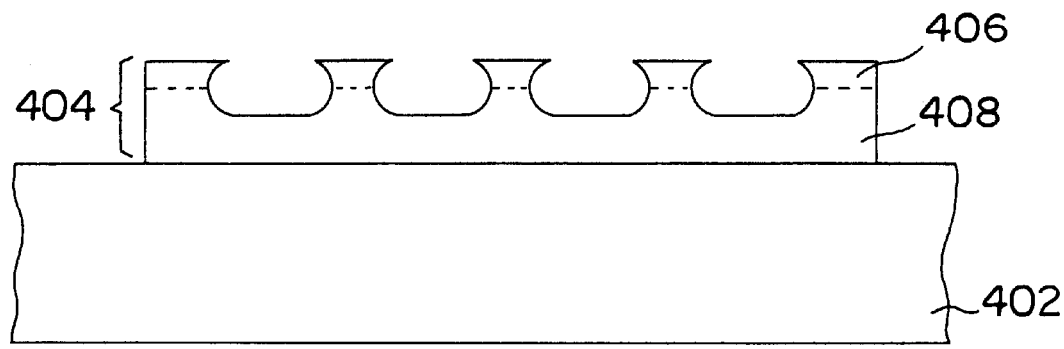
FIG. 10 illustrates a process of manufacture of a fourth exemplary assembly according to the present invention.

FIG. 10 illustrates an alternate process of manufacturing an assembly according to the present invention. A multilayer coupling pad 404 is formed upon the component 402 in FIG. 10. An upper layer 406 is more etch resistant than the lower layer 408. The etch resistant upper layer 406 is then patterned similar to the pattern formed in the etch resistant layer 870 of FIG. 8. The lower layer 408 is then etched through the openings in the upper layer 406 to form an assembly according to the present invention.

In an exemplary embodiment, the upper layer 406 is comprised of about 95% copper and 5% chrome. As known to those skilled in the art, the coupling pad 404 does not necessarily need to be formed of distinct layers. The coupling pad 404 may be a single pad varying in composition from its lower portion toward its upper portion.

FIGS. 11 and 12 illustrate a process of manufacture of the third exemplary assembly 300 according to the present invention. As shown in FIG. 11, a coupling pad 304 is formed upon a component 302. An etch resistant layer 330 is formed upon the coupling layer 304. The etch resistant layer 330 is patterned to form heads 314 (see also FIG. 3). The coupling pad 304 is then etched through the lo openings 320 between the heads 314 to form the connectors 306 as shown in FIG. 3.

Other processes of manufacture known to those skilled in the art may be used to form an assembly according to the present invention. For example, a coupling pad may be formed with at least an upper layer which is malleable. Mesas having substantially vertical side walls may then be formed in the coupling pad. The top of each mesa may then be peened to flatten and widen the top of the mesa to form a connector according to the present invention.

The present invention may be used to reduce the cost of testing and replacement of improperly functioning circuit modules. For example, a circuit module may be removably interlocked with a circuit board according to the teachings of the present invention to form both a mechanical and an electrical connection. The circuit module and circuit board may then be tested. If the circuit module needs to be replaced, it may be removed from the circuit board and another circuit module may be removably interlocked with the circuit board. Thus, a circuit module may be installed, tested, and removed without heating, without solder, and without additional surface preparation.

Defects due to solder bridges and solder opens may be reduced by the present invention because solder is not necessary to connect a circuit board to a circuit module according to the present invention. This advantage also reduces the need to compromise between large conductive pads having a risk of shorting to adjacent pads and small conductive pads resulting in a weak connection. The risk of solder bridges is reduced because solder is not necessary to make connections according to the present invention. The risk of a weak connection due to a small conductive pad is reduced because mechanical connection is enhanced by the interlocking mechanism of the present invention.

Alternatively, solder may be used in combination with the teachings of the present invention while still retaining the advantages of the present invention. For example, solder may be deposited in each cavity 210 or solder balls may be formed on the top 322 of a head 314 of a connector. After interlocking one assembly with another, the assembly may be sent through a re-flow furnace to form a metallurgical connection between the connectors of one assembly and the connectors of the other assembly. Cost savings may still be realized by reduced surface preparation because any solder remaining on a circuit board after a circuit module is removed may be isolated to a cavity of a connector. In addition, because cavities may isolate the solder, coupling pads may be close together without increasing the risk of shorts due to solder bridges.

Existing circuit modules and circuit boards may be adapted to implement interlockable connectors according to the present invention. For example, conductive pads used for ball grid array technology may be replaced with coupling pads having connectors formed in them according to the present invention.

The connectors according the present invention are integrated with the coupling pads. This configuration reduces costs by eliminating the need to separately form connectors and then connect the connectors to a coupling pad. Costs are also reduced by the ability to reduce the circuit board and circuit module area used for each connection. The connectors of the present invention may be formed using lithographic techniques known to those skilled in the art to form small connectors.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process of manufacturing a removably interlockable assembly comprising the steps of:

providing a first component;

forming a first coupling pad by:
   (a) forming a first pad layer upon the first component, and
   (b) forming an etch resistant layer upon the first pad layer; and forming a first connector in the first coupling pad that is adapted to be removably interlockable with a compatible connector by:
   (a) patterning the etch resistant layer to form a plurality of openings in the etch resistant layer, and
   (b) selectively etching portions of the first pad layer through the openings in the etch resistant layer to form mesas in the first pad layer having a mesa top and a mesa width.

2. A process of manufacturing a removably interlockable assembly according to claim 1 wherein the etch resistant layer:
   (a) substantially remains upon the mesa top after the first pad layer has been selectively etched, and
   (b) has a width greater than the mesa width.

3. A process of manufacturing a removably interlockable assembly according to claim 1 further including the step of applying an epoxy layer on a surface of the first component opposite from the surface on which the first coupling pad is formed and on exposed portions of a mating surface of the compatible connector.

4. A process of manufacturing a removably interlockable assembly according to claim 1 further including the step of peening the top of the mesa to flatten and widen the top of the mesa.

5. A process of manufacturing a removably interlockable assembly according to claim 1
   (a) wherein the etch resistant layer substantially remains upon the mesa top after the first pad layer has been selectively etched, and
   (b) further including the step of peening the top of the mesa to flatten and widen the top of the mesa.

6. A process of manufacturing a removably interlockable assembly according to claim 4 further including the step of applying an epoxy layer on a surface of the first component opposite from the surface on which the first coupling pad is formed and on exposed portions of a mating surface of the compatible connector.

7. A process of manufacturing a removably interlockable assembly according to claim 5 further including the step of applying an epoxy layer on a surface of the first component opposite from the surface on which the first coupling pad is formed and on exposed portions of a mating surface of the compatible connector.

8. A process of manufacturing a removably interlockable assembly according to claim 1 wherein the mesa top has a width greater than the mesa width.

9. A process of manufacturing a removably interlockable assembly according to claim 8 further including the step of peening the top of the mesa to flatten and widen the top of the mesa to form the mesa top having a width greater than the mesa width.

* * * * *